United States Patent [19]

Yamazaki et al.

[11] Patent Number: 4,986,460
[45] Date of Patent: Jan. 22, 1991

[54] APPARATUS FOR MANUFACTURING SEMICONDUCTOR DEVICES

[75] Inventors: Nobuto Yamazaki; Hiroshi Ushiki; Kenji Katakubo, all of Tachikawa, Japan

[73] Assignee: Kabushiki Kaisha Shinkawa, Tokyo, Japan

[21] Appl. No.: 374,542

[22] Filed: Jun. 30, 1989

[30] Foreign Application Priority Data

Jul. 4, 1988 [JP] Japan .................. 63-166543

[51] Int. Cl.$^5$ .................. B23K 20/00; H05K 3/00
[52] U.S. Cl. .................. 228/4.5; 228/175
[58] Field of Search .................. 228/4.5, 1.1, 179, 175, 228/220, 6.2

[56] References Cited

U.S. PATENT DOCUMENTS 4,301,958 11/1981 Hatakenaka et al. .................. 228/4.5
4,583,676 4/1986 Pena et al. .................. 228/179

FOREIGN PATENT DOCUMENTS 82736 5/1984 Japan .................. 228/4.5

Primary Examiner—Sam Heinrich
Attorney, Agent, or Firm—Koda and Androlia

[57] ABSTRACT

An apparatus for manufacturing semiconductor devices wherein a curing oven cures samples of dies bonded to lead frames by adhesives, a wire bonder which is installed adjacent to and in line with the curing oven wire-bonds the samples which have been cured in the curing oven, and a sample feeding mechanism feeds the samples to the curing oven and then to a wire-bonding section of the wire bonder; thus, there is no need for separate transport of the samples following curing or for repeated heating of the samples, and product reliability and productivity are improved. In addition, there is no need for a special curing oven or special measures to prevent oxidation following curing.

4 Claims, 3 Drawing Sheets

1 PITCH

APPARATUS FOR MANUFACTURING SEMICONDUCTOR DEVICES

BACKGROUND OF THE INVENTION

1. Field of the Invention

The present invention relates to an apparatus for manufacturing semiconductor devices, and specifically to a manufacturing apparatus which cures and wire-bonds the samples being manufactured.

2. Prior Art

In the prior art, semiconductor devices are manufactured by a process such as that illustrated in the flow chart of FIG. 6. In particular, an adhesive is dropped at 71 by an adhesive dropping device 70 into the die bonding area of a lead frame. Then a die is bonded at 73 by a die bonder 72 to the area where the adhesive has been dropped. The resulting sample is cured at 75 by a curing oven 74 so that the adhesive is dried, thus fixing the die to the lead frame. Afterward, wire bonding 77 is performed by wire bonder 76.

In such conventional processes, the lead frames are packed into a magazine following the die bonding 73, and a multiple number of such magazines (i.e., a number of magazines corresponding to the capacity of the curing oven 74) are collected and placed inside the curing oven 74, where curing is accomplished by heating. After curing is completed, a worker removes the magazines from the curing oven 74, carries the magazine to the wire bonder 76 and sets the magazine in the loader part of the wire bonder 76. Wire bonding 77 is performed by the wire bonder 76. Alternately, in the case of an in-line system, the lead frames are sent to the wire bonder 76 by a belt conveyor which is open to the atmosphere following the curing 75 of the samples.

In the above described conventional processes, the curing oven 74 and wire bonder 76 are separated from each other. Accordingly, it is necessary to transport the lead frames after the curing. Furthermore, in cases where the lead frames or the leads formed on the lead frames consist of copper materials which easily oxidize, it is necessary to cool the lead frames sufficiently to prevent oxidation following the curing before the lead frames can be removed from the curing oven. In addition to requiring a great deal of time, it is also necessary to use a special curing oven which is equipped with a cooling apparatus. Furthermore, the lead frames are heated and cooled a number of times since they must be heated and cooled when they are cured and again when they are wire bonded. As a result, reliability of the product decreases.

In cases where the lead frames must be stored for a long period of time following curing, it is necessary to take steps to prevent oxidation. In addition, in cases where the lead frames are transported from the curing oven 74 to the wire bonder 76 by a belt conveyor which is open to the atmosphere in an in-line system, oxidation occurs while the lead frames are being transported. Accordingly, it is necessary to transport the lead frames after they have been sufficiently cooled in the curing oven (as described above) or to use lead frames wherein bonding areas have been partially plated beforehand.

SUMMARY OF THE INVENTION

The object of the present invention is to provide an apparatus for manufacturing semiconductor devices in which there is no need for transport or storage of the samples following curing.

It is another object of the present invention to provide an apparatus wherein there is no need for repeated heating of the samples.

It is still another object of the present invention to provide an apparatus which produces a reliable product and in which the productivity of the apparatus is improved.

It is still a further object of the present invention to provide an apparatus in which there is no need for a special curing oven or any special measures to prevent oxidation following curing.

The above objects of the present invention are achieved by means of an apparatus which is equipped with a curing oven which cures samples consisting of dies bonded to lead frames by means of an adhesive, a wire bonder which is installed adjacent to and in line with the curing oven and a sample feeding mechanism which feeds the samples through the curing oven and to the bonding part of the wire bonder Thus, in the present invention since the curing oven and wire bonder are installed adjacent and in line with each other, the samples are immediately fed into the wire bonder after curing. Accordingly, there is no need for a separate sample transporting process or for a special curing oven. Furthermore, no special steps need be taken to prevent oxidation after curing. In addition, since the samples are sent to the wire bonder while still hot from curing in the curing oven, there is no need to cool the samples after curing and thus, no need to heat them again. As a result, product reliability and productivity are improved.

DETAILED DESCRIPTION OF THE INVENTION

Figure 1:
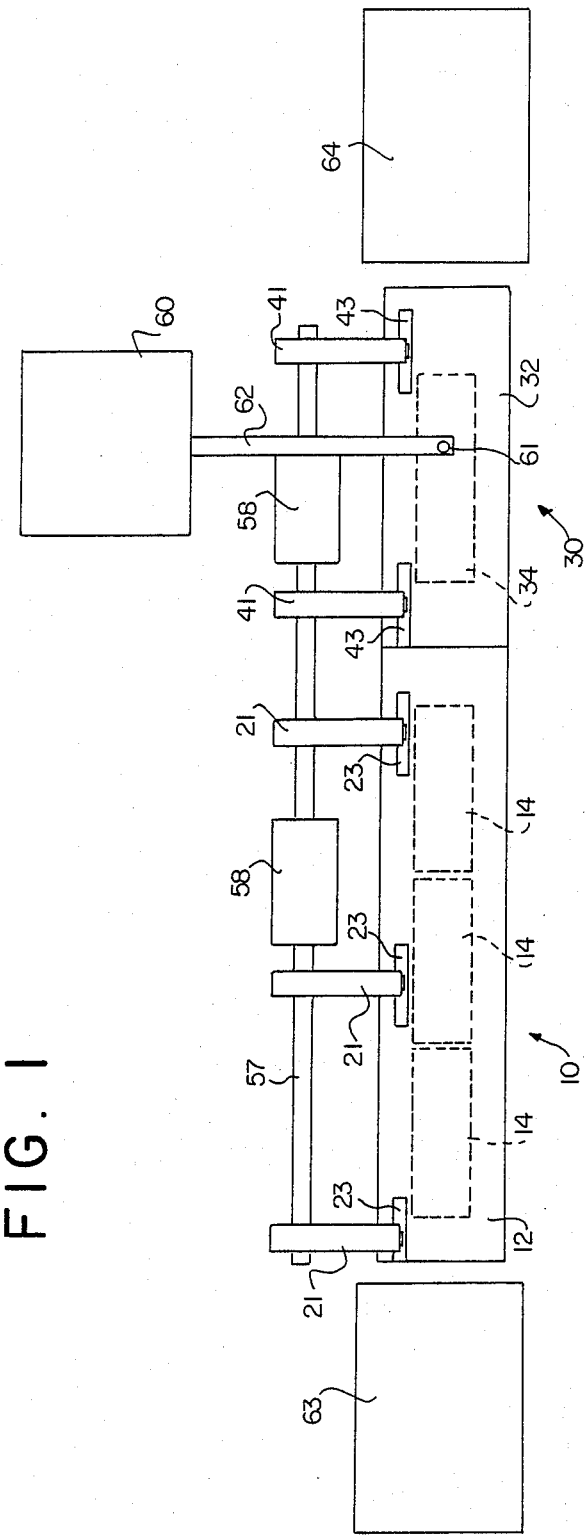
FIG. 1 is a plan view illustrating one embodiment of the present invention.
Figure 2:
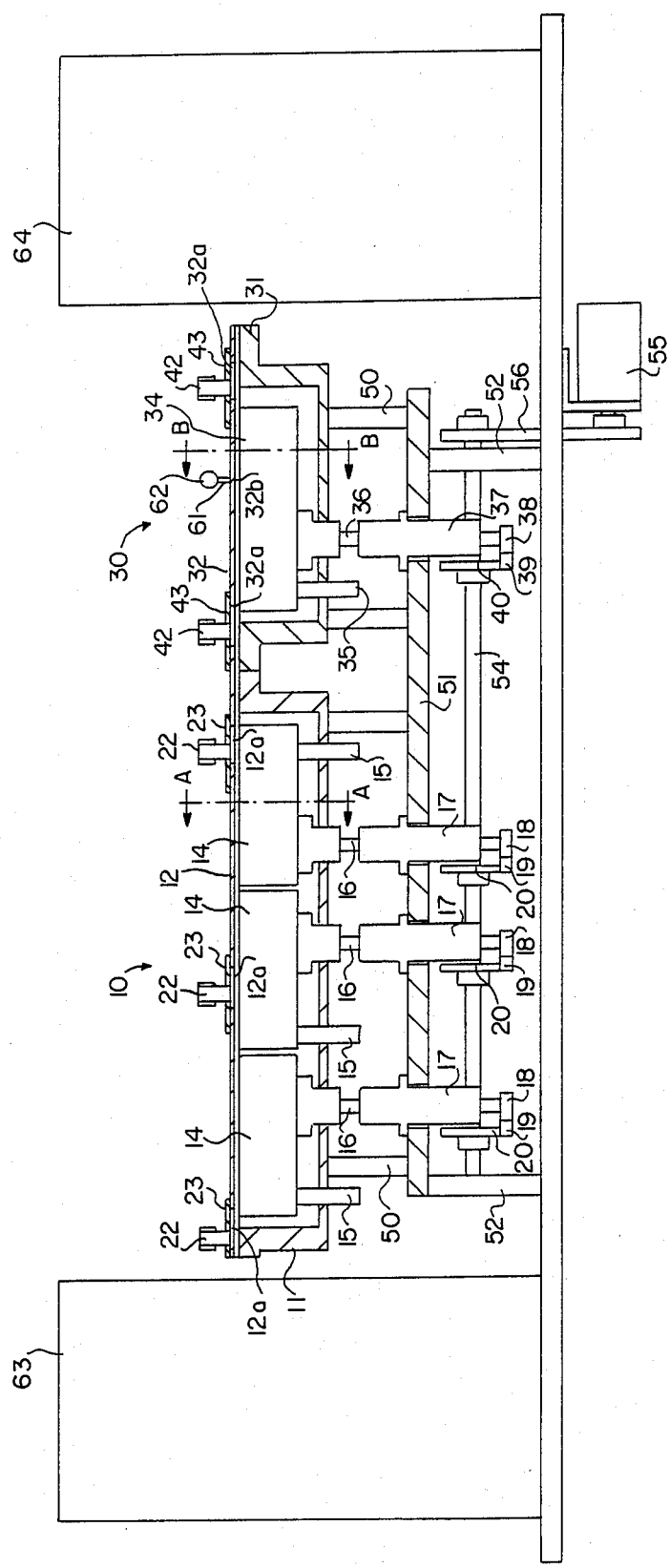
FIG. 2 is a sectional front view of the embodiment shown in FIG. 1.
Figure 3:
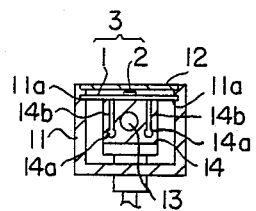
FIG. 3 is a cross-sectional view taken along the line II—II of FIG. 2.
Figure 4:
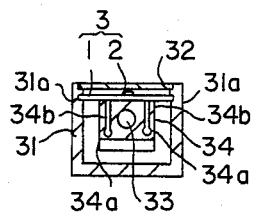
FIG. 4 is a cross-sectional view taken along the line IV—IV of FIG. 2.
Figure 6:
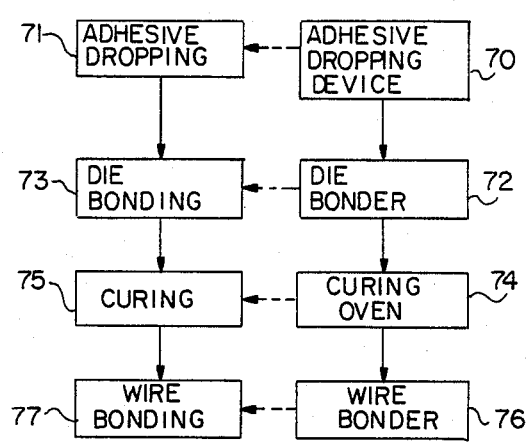
FIG. 6 is a flow-chart illustrating the operation of the prior art.
Figure 5:
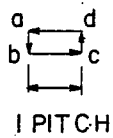
FIG. 5 is a flow-chart illustrating the operation of the present invention.

An embodiment of the present invention will be described with reference to FIGS. 1-5 wherein like reference numerals denote like elements.

In FIGS. 1-4, a curing oven 10 for curing samples 3 consisting of dies 2 bonded to lead frame 1, and a wire bonder 30 for bonding wires to the samples 30 are installed in line with each other. Guide grooves 11a and 31a for guiding the samples 3 are formed in both side surfaces of the housing 11 and 31 of the curing oven 10 and wire bonder 30, and respective lids 12 and 32 are fastened to the upper surfaces of the housings 11 and 31 so that the interior of the apparatus is closed off. Heating blocks 14 and 34 which contain heaters 13 and 33 are respectively installed inside the housings 11 and 31. Holes 14a and 34a are formed in the heating blocks 14 and 34 which allow the flow of forming gas (e.g. inert gas such as nitrogen, etc. or a mixed gas consisting of hydrogen and an inert gas). The holes 14a and 34a are parallel to the feeding direction of the samples 3. These holes 14a and 34a are further connected to the upper surfaces of the heating blocks 14 and 34 by holes 14b and 34b. In addition, forming gas supply ports 15 and 35 which supply the forming gas are connected to the holes 14a and 34a.

The housings 11 and 31 are fastened to a housing support plate 51 by supporting columns 50. This housing support 51 is fastened to a base plate 53 by supporting columns 52. Vertically moving rods 16 and 36 are fastened to the under surfaces of the heating blocks 14 and 34. These vertically moving rods 16 and 36 are inserted so that they are free to move upward and downward in bearings 17 and 37 which are fastened to the housing support plate 51. Cam follower support plates 18 and 38 are fastened to the lower ends of the vertically moving rods 16 and 36. Cam followers 19 and 39 are supported so that they are free to rotate on these cam follower support plates 18 and 38. Furthermore, a cam shaft 54 is supported so that it is free to rotate on the supporting columns 52, and cams 20 and 40 are fastened to this cam shaft 54. The cam follower support plates 18 and 38 are driven upward by springs (not shown in the Figures) so that the cam followers 19 and 39 are pressed against the cams 20 and 40. The cam shaft 54 is driven via a belt 56 by a motor 55 which is fastened to the base plate 53.

A sample feeding shaft 57 is installed on the side surfaces of the housings 11 and 31. This sample feeding shaft 57 is installed so that it is free to slide in the bearing 58 which are driven upward and downward by a vertical driving means (not shown in the Figures). The sample feeding shaft 57 is also arranged so that it can be driven (in a freely sliding motion) by a horizontal driving means. Furthermore, claw levers 21 and 41 are fastened to the sample feeding shaft 57, and feeding claws 22 and 42 which feed the samples 3 one pitch at a time are fastened to the claw levers 21 and 41. Long feeding claw escape holes 12a and 32a are formed in the lids 12 and 32 so that there is no interference with the movement of the feeding claws 22 and 42. Furthermore, covers 23 and 43 are positioned on the lids 12 and 32 so that the feeding claw escape holes 12a and 32a covered. Feeding claw windows through which the feeding claws 22 and 42 pass (with some play allowed) are formed in the covers 23 and 43.

A bonding head 60 is installed on one side of the housing 31 used for the wire bonder 30. This bonding head 60 is fastened to an X-Y table (universally known and not shown in the Figures) which drives the bonding head in the X and Y directions. A bonding arm 62 which has a bonding tool 61 fastened to one end is installed on the bonding head 60 in such a manner that the bonding arm 62 can be driven upward and downward by a vertical driving means (not shown in the Figures). Furthermore, a bonding window 32b is formed in the lid 32 corresponding to the position of the bonding tool 61.

Samples 3 are fed into the housing 11 of the curing oven 10 by a sample supplying device 63. The samples 3 are discharged from the housing 31 of the wire bonder 30 and then stored in the sample storage device 64.

Next a description of the operation of the present invention will be given below.

Samples 3 supplied from the sample supplying device 63 are intermittently fed at a uniform pitch by the feeding claws 22 and 42 so that the samples 3 pass through the housing 11 of the curing oven 10 and the housing 31 of the wire bonder 30. The samples 3 are then stored in the sample storage device 64.

The samples 3 are fed by the feeding claws 22 and 42 in the following manner. With the heating blocks 14 and 34 in a lowered position, and with the feeding claws 22 and 42 in the positions indicated in FIG. 2, one cycle of vertical motion and horizontal motion of the feeding claws 22 and 42 is performed in the order shown in FIG. 5, so that the sample 3 are fed by one pitch. Vertical movement of the feeding claws 22 and 42 is accomplished by the vertical movement (a to b and c to d) of the bearings 58, and the horizontal movement (b to c and d to a) of the feeding claws 22 and 42 is accomplished by the horizontal movement of the sample feeding shaft 57. In other words, when the feeding claws 22 and 42 are at points a and d (in a raised position) in FIG. 5, they are engaged with the covers 23 and 43 only. When the feeding claws are at points b and c (in a lowered position), the feeding claws 22 and 42 engage with holes in the lead frames 1 of the samples 3.

Each sample 3 is fed one pitch by one cycle of movement of the feeding claws 22 and 42. When this happens, the heating blocks 14 and 34 are raised and pressed against the samples 3 so that the samples 3 are heated. Raising of the heating blocks 14 and 34 is accomplished as follows When the motor 55 is actuated so that the cams 20 and 40 rotate along with the cam shaft 54, the cam followers 19 and 39 are raised in accordance with the descending profiles of the cams 20 and 40 resulting in that the heating blocks 14 and 34 are raised via the cam follower support plates 18 and 38 and the vertically moving rods 16 and 36.

When the heating blocks 14 and 34 are pressed against the samples 3 as described above, the adhesive interposed between the lead frame 1 and the die 2 in each sample 3 is cured in the curing oven 10. Furthermore, in the wire bonder 30, the bonding head 60 is moved in the X and Y directions and the bonding arm 62 is moved vertically, so that wire bonding is performed by the bonding tool 61.

When wiring bonding is completed, the motor 55 is actuated in the reverse direction, so that the heating blocks 14 and 34 are lowered. Afterward, the feeding claws 22 and 42 perform one cycle of movement as described above, so that each sample 3 is fed by one pitch. The heating blocks 14 and 34 are then raised and pressed against the samples 3 so that curing is performed in the curing oven 10 and wiring bonding in the wire bonder 30. Afterward, the entire operation is repeated.

Thus, the samples 3 which have been cured in the curing oven 10 are supplied to the wire bonder 30 and accordingly, there is no need for a device to prevent oxidation after curing or a need for any separate transport of the samples after curing. Furthermore, since the samples 3 have been heated to a temperature sufficient for wire bonding by the curing oven 10, the heating block 34 of the wire bonder 30 need only maintain the samples 3 at a fixed temperature. In cases where a mixed gas consisting of hydrogen and an insert gas is caused to flow between the lid 32 and the heating block 34 of the wire bonder 30, reduction of the samples 3 can be sufficiently accomplished within the time period in which the temperature is maintained. Accordingly, the bonding ability and productivity of the samples is greatly improved. Furthermore, since the samples 3 are heated and cooled only once, reliability of the product is also improved.

The curing time and the time required for wire bonding vary according to the material which makes up the samples 3 and the number of wires bonded to each die 2. For example in a case where the number of wires to be bonded to the sample is 16 and the size of each die is 2 mm, wire bonding would take approximately 4 seconds and curing would take about 10 to 40 seconds. Accordingly, the movement cycle is determined according to the time required for wire bonding. In this case, it is necessary to increase the length of the curing oven so that the samples are cured for the necessary curing time.

In the above described embodiment the heating blocks 14 consist of three heating blocks. However, it would be possible to use a single integral heating block, two heating blocks or four or more heating blocks. In addition, in the above described embodiment the housing 11 of the curing oven 10 and the housing 31 of the wire bonder 30 are separate from each other; however, the housings 11 and 31 could be a single integral unit. Also, since gas is generated during the curing of the adhesive in the curing oven 10, it would be possible to install a pipe in the covers 23 or in the housing 11 to remove gas from the interior of the housing 11 using suction via this pipe so that the interior of the curing oven 10 is maintained in a clean state.

We claim:

1. An apparatus for manufacturing semiconductor devices characterized in that said apparatus comprises a curing oven which cures samples consisting of dies bonded to lead frames by means of an adhesive, a wire bonder which is installed adjacent to and in line with said curing oven, said wire bonder wire-bonding said samples that have been cured by said curing oven, said wire bonder being further equipped with a bonding head which drives a bonding tool in X and Y directions and vertically, a sample-feeding mechanism which feeds said samples into said curing oven and from said curing oven into a bonding part of said wire bonder, a housing for said curing oven and said wire bonder, guide grooves formed in said housing for guiding said samples, a lid which is fastened to an upper surface of said housing, and a heating block provided in said housing.

2. An apparatus for manufacturing semiconductor devices as defined in claim 1, wherein said guide grooves in said housing of said curing oven and said guide grooves in said housing of said wire bonder are formed on the same plane.

3. An apparatus for manufacturing semiconductor devices as defined in claim 1, wherein said housing of said curing oven and said housing of said wire bonder are formed as a single integral part.

4. An apparatus for manufacturing semiconductor devices as defined in claim 2, wherein said housing of said curing oven and said housing of said wire bonder are formed as a single integral part.

* * * * *

UNITED STATES PATENT AND TRADEMARK OFFICE
CERTIFICATE OF CORRECTION

PATENT NO. : 4,986,460

DATED : January 22, 1991

INVENTOR(S) : YAMAZAKI et al.

It is certified that error appears in the above-identified patent and that said Letters Patent is hereby corrected as shown below:

Title Page:
Item 75: Change "Kenji Katakubo" to --Kenji Kitakubo--.

Signed and Sealed this

Sixth Day of October, 1992

*Attest:*

DOUGLAS B. COMER

*Attesting Officer*  *Acting Commissioner of Patents and Trademarks*